United States Patent
Tan et al.

(10) Patent No.: US 8,822,275 B2
(45) Date of Patent: Sep. 2, 2014

(54) COMPOSITE WAFER INCLUDING A MOLDED WAFER AND A SECOND WAFER

(75) Inventors: Michael Renne Ty Tan, Menlo Park, CA (US); Georgios Panotopoulos, Berkeley, CA (US); Paul Kessler Rosenberg, Sunnyvale, CA (US); Sagi Varghese Mathai, Berkeley, CA (US); Wayne Victor Sorin, Mountain View, CA (US); Susant K Patra, Brentwood, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 121 days.

(21) Appl. No.: 13/459,924

(22) Filed: Apr. 30, 2012

(65) Prior Publication Data
US 2013/0286614 A1  Oct. 31, 2013

(51) Int. Cl.
*H01L 21/78* (2006.01)

(52) U.S. Cl.
USPC .............. 438/114; 438/465; 257/E21.603

(58) Field of Classification Search
USPC ............... 438/114, 465, 977; 257/E21.603
See application file for complete search history.

(56) References Cited

U.S. PATENT DOCUMENTS

| | | | |
|---|---|---|---|
| 6,328,482 B1 * | 12/2001 | Jian | 385/88 |
| 7,670,866 B2 | 3/2010 | Sun et al. | |
| 7,777,311 B2 | 8/2010 | Utsumi et al. | |
| 7,928,549 B2 * | 4/2011 | Chen et al. | 257/686 |
| 8,008,128 B2 | 8/2011 | Tan et al. | |
| 8,222,084 B2 * | 7/2012 | Dallesasse et al. | 438/113 |
| 2007/0069421 A1 | 3/2007 | Maeda | |
| 2007/0157953 A1 | 7/2007 | Mahdi et al. | |

OTHER PUBLICATIONS

Lemoff et al., Maui: Enabling Fiber-to-the Processor With Parallel Multiwavelength Optical Interconnects, Journal of Lightwave Technology, vol. 22, No. 9, Sep. 2004: 2043-2054.

* cited by examiner

*Primary Examiner* — Chandra Chaudhari
(74) *Attorney, Agent, or Firm* — Aaron Ward

(57) ABSTRACT

A composite wafer includes a molded wafer and a second wafer. The molded wafer includes a plurality of first components, and the second wafer includes a plurality of second components. The second wafer is combined with the molded wafer to form the composite wafer. At least one of the first components is aligned with at least one of the second components to form a multi-component element. The multi-component element is singulatable from the composite wafer.

12 Claims, 8 Drawing Sheets

COMPOSITE WAFER INCLUDING A MOLDED WAFER AND A SECOND WAFER

BACKGROUND

Mechanical, optical, and other components can be manufactured using molding techniques, such as injection molding, stamping, etc. to form individual/singulated molded parts. However singulated parts are incompatible with traditional semiconductor processes, which are designed for wafer substrates. If a molded part is to have additional processing performed, such as the application of coatings, the molded part needs to be mounted on a special carrier, processed, and then removed from the special carrier. Additionally, a singulated molded element needs to be aligned to a singulated assembly. This is a sequential, high-cost process. Molding of small components can have a need for the use of runners, resulting in substantial waste of material (wastage may even exceed the amount of material used for the finished component). Material waste can be costly, particularly when expensive materials, such as Zeonex, are used to mold the components.

BRIEF DESCRIPTION OF THE DRAWINGS/FIGURES

DETAILED DESCRIPTION

The advantages of molded elements may be combined with the advantages of elements produced in wafer format, by molding wafers of such elements, instead of molding single such elements. These wafers can be processed using standard semiconductor processes, bonded to other wafers, and finally diced/separated (thereby avoiding use of runners or other wastage). This approach allows leveraging of well-established semiconductor processes, and decreases the cost of assembly of systems comprised of multiple components. Components may be manufactured with traditional, wafer-scale semiconductor techniques. These greatly simplify additional processing, and allow alignment in batch/wafer with subsequent singulation. Singulation can involve separating interconnected components into individual/independent components, based on cutting, routing, dicing, scoring, breaking, shearing, break-away, perforation, punch and die, and/or other techniques of separating a batch of interconnected components. Components may include optical devices, such as optical transmitter and/or receiver engines, as well as micro-optic elements (lens arrays etc.). Semiconductor processes/techniques may include application of patterned coatings, photolithography, etching, and other processing.

Figure 1:
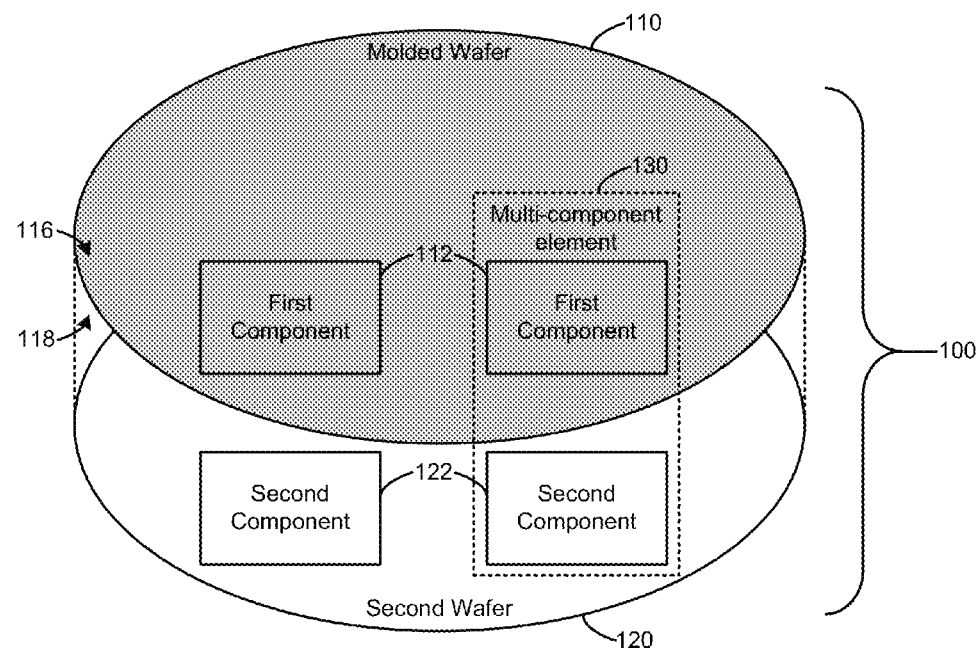
FIG. 1 is an exploded view block diagram of a composite wafer including a molded wafer according to an example.

FIG. 1 is an exploded view block diagram of a composite wafer 100 including a molded wafer 110 according to an example. The composite wafer 100 also includes a second wafer 120. In alternate examples, the composite wafer 100 may include additional wafers (not shown). The molded wafer 110 includes a plurality of first components 112. The second wafer 120 includes a plurality of second components 122. A wafer, e.g., the molded wafer 110, includes a first surface 116 and a second surface 118. A first component 112 and second component 122 may be combined to form a multi-component element 130.

The molded wafer 110 may include features on the first surface 116 and the second surface 118. Thus, first components 112 similarly may include features on first surface 116 and second surface 118. Second components 122 also may include features on multiple surfaces. Thus, the multi-component element 130 formed of a first component 112 and second component 122 may include features sandwiched within the multi-component element 130, by virtue of those features being on an inner-facing surface of the first component 112 and/or second component 122.

First components 112 may include functional features that add value to the multi-component element 130, beyond merely serving a generic function such as a spacer/insulator or other structural element to protect other components. For example, the first component 112 may be a lens, connector, or other element to provide a feature having inherent value, regardless of whether it is combined with other components/wafers or whether it provides a relative function vis-à-vis the other component. Components may include mechanical features (e.g., fiber connectors, movable components, etc.), and may be complicated multi-part structures such as an optical zig-zag and/or optical power splitter. Furthermore, the first components 112 may include features based on processing the first component 112 on multiple sides/surfaces.

Multiple wafers may be combined, and examples provided herein may be used iteratively. For example, molded wafer 110, second wafer 120, and at least one other wafer may be combined into composite wafer 100. A first composite wafer 100 may be used as molded wafer 110 and/or second wafer 120 to form a second composite wafer 100, and so on.

Wafers may be formed of moldable materials such as plastic (e.g., Zeonex), as well as other materials such as glass, semiconductor, integrated circuits, and others. Materials can be transparent and/or reflective at various wavelengths for optical uses, for example Gallium Arsenide (GaAs) that is transparent at a 1.5 µm wavelength. Materials may be used that have characteristics (e.g., temperature range, refractive index, etc.) compatible with molding and/or optics.

In an example, the multi-component element 130 may be an optical engine (e.g., transmitter and/or receiver), assembled through the alignment and bonding of a number of wafers and components, resulting in a first composite wafer 100 of transmitters. That composite wafer 100 may, in turn, be combined with another wafer. For example, combined with a molded wafer 110 that includes micro-optic first components 112, arranged to align with the transmitters of the first composite wafer 100. Additional wafer-scale semiconductor processing may be performed on these various components/elements of the wafers, such as the application of patterned coatings. Such processing can be completed using low-cost photolithographic processes, without a need for special carriers and complicated mounting and un-mounting operations that would be used for non-wafer-scale components. The molded wafer 110 may be aligned to the first composite wafer 100 of transmitter components, using a single alignment process, and the two wafers can be bonded to form a second composite wafer. Singulating the resulting second composite wafer results in a plurality of individual multi-component elements 130 (e.g., optical engines), having aligned and attached micro-optical components, based on wafer-scale processing and/or assembly. Thus, the individual multi-component elements 130 are produced in large quantity while avoiding tedious individual assembly.

In addition to production savings, additional savings may be realized based on the type of wafers used. Molded wafers may be much less expensive to manufacture than glass, semiconductor, or other material wafers. Molded wafers can be post-processed using wafer-scale processing, including photolithographic processes and infrastructure, and do not have a need for special mounts or complicated and costly mounting and un-mounting processes. Molded wafers, in contrast to individually aligning and bonding already-singulated elements, can be aligned and bonded in wafer/batch mode, resulting in much lower processing/assembly costs. Overall, this approach may combine the low cost of the molded optical elements, with the low cost of wafer-based processes, essentially retaining advantages from each approach without incurring disadvantages.

Wafers may be rigid and/or moldable, and may be formed and/or processed based on various techniques to generate features on the wafer, such as being injection molded, compressed, compacted/sintered, expanded into a mold, extruded, laminated, cut/sawed as discs from a source stock, spun out, formed based on deposition, sputtering, etching, bonding, and so on. A pliable wafer material may be pressed using a die or cast to provide a processed wafer including a plurality of components. Wafers may be cleaned, grinded, polished, and otherwise prepped for fabrication/further processing, including photography, patterning, deposition, coating, thinning, marking, masking, formation of metal layers and/or features such as soldering bumps, and the like. Additionally, a wafer may be provided based on a combination of techniques, including multiple molding/layering/depositing/pressing, and wafers may be processed based on additional techniques such as placing separate elements onto a wafer (pick-and-place, reflow soldering, etc.), and then subsequently further processing the wafer. A composite wafer may be provided based on a combination of other wafers that are molded/pressed/bonded together, and the resulting composite wafer may be available for further wafer-scale processing to form part of yet a another layer in another composite wafer.

Figure 2:
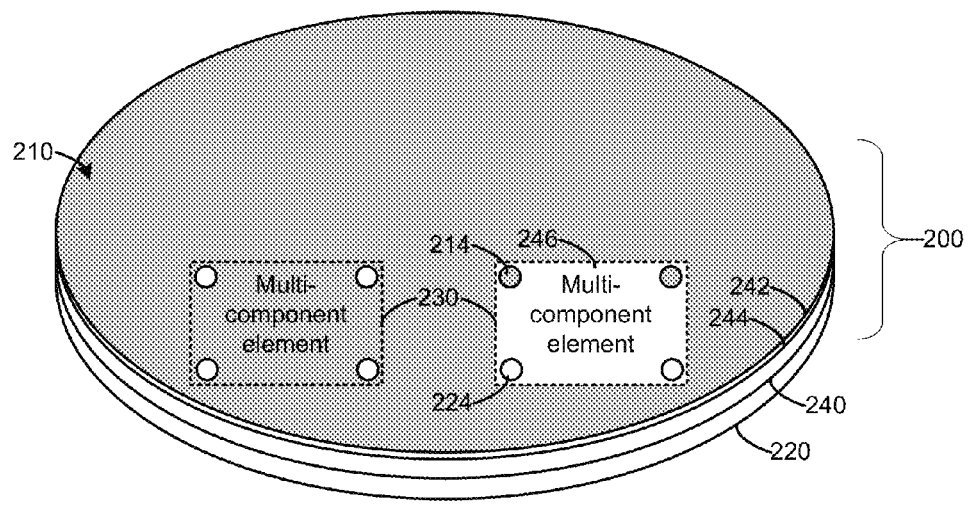
FIG. 2 is a block diagram of a composite wafer including a molded wafer according to an example.

FIG. 2 is a block diagram of a composite wafer 200 including a molded wafer 210 according to an example. The composite wafer 200 includes second wafer 220 assembled with molded wafer 210 based on bond 240, to form a plurality of multi-component elements 230.

The multi-component elements 230 can include mating features, such as first mating feature 214 and second mating feature 224. The mating features may provide alignment and/or interlocking benefits. The first mating features 214 may be provided on the molded wafer 210, and the second mating features 224 may be provided on the second wafer 220. However, various wafers may include or omit various mating features.

Mating/interlocking features can greatly simplify and cost-reduce the assembly of singulated components. For example, a multi-component element 230 may be assembled without the use of bond 240, based on interlocking first mating feature 214 and second mating feature 224. In alternate examples, elements may first be singulated, and then assembled using the molded mating/interlocking features.

A multi-component element 230 may include a processed component 246. For example, the processed component 246 may be a result of processing at least one wafer, and/or the result of a processed layer 242 and/or an unprocessed layer 244 of a wafer (e.g., molded wafer 210, second wafer 220, and/or other wafers not specifically shown). Processing may include adding a layer, and/or removing a layer (e.g., etching). The multi-component element 246 also may include additional elements not shown, such as spacers, seals, ferrules, and other components.

Figure 3:
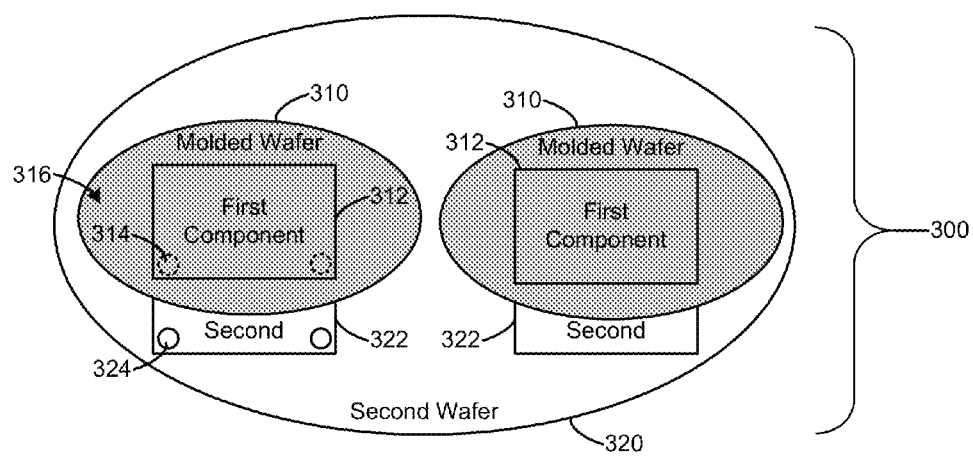
FIG. 3 is a block diagram of a composite wafer including a plurality of molded wafers according to an example.

FIG. 3 is a block diagram of a composite wafer 300 including a plurality of molded wafers 310 according to an example. The composite wafer 300 includes a second wafer 320. Each molded wafer 310 includes at least one first component 312. The first component 312 and/or molded wafer 310 may include a first mating feature 314. The second wafer 320 includes a plurality of second components 322. A second component 322 may include a second mating feature 324.

In the example shown in FIG. 3, the molded elements, including first components 312, are implemented in a multitude of plastic molded wafers 310. Although shown as circular, the molded wafers 310 may be other shapes, including shapes that may be tiled to fit together and cover the second wafer 320, e.g., without gaps or overlaps between the molded wafers 310. The molded wafers 310 may be stacked. The molded wafers 310 may be arranged to be orthogonal. In an example, multiple molded wafers 310 of optical elements (e.g., lenses/lens arrays) may be tiled onto a larger second wafer 320 of transmitters. The molded wafer 310 and/or the second wafer 320 may themselves be a composite wafer formed of other wafers. The molded wafers 310 may be assembled with the second wafer 320 based on the first mating feature 314 and second mating feature 324, and/or may be assembled based on glue or other bonding element/procedure. In an example, a molded wafer 310 is welded to a second wafer 320 that is also molded (e.g., each wafer is formed of materials compatible with welding, e.g., compatible plastics used for pressure welding).

Figure 4A:
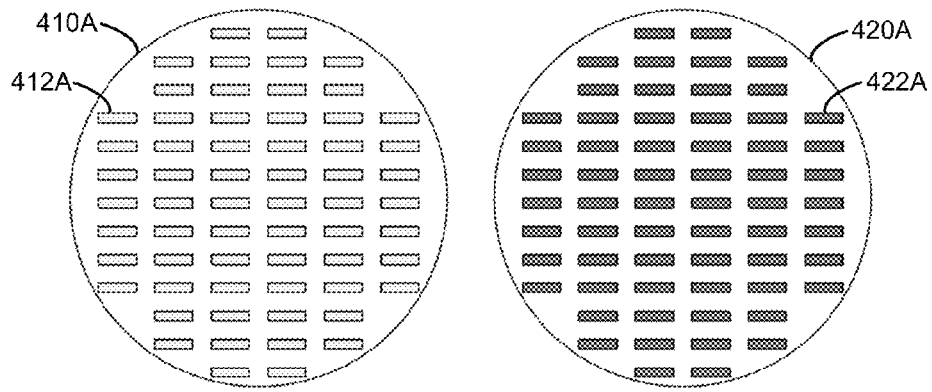
FIGS. 4A-4C are a block diagrams of an assembly of a composite wafer including a molded wafer according to an example.
Figure 4B:
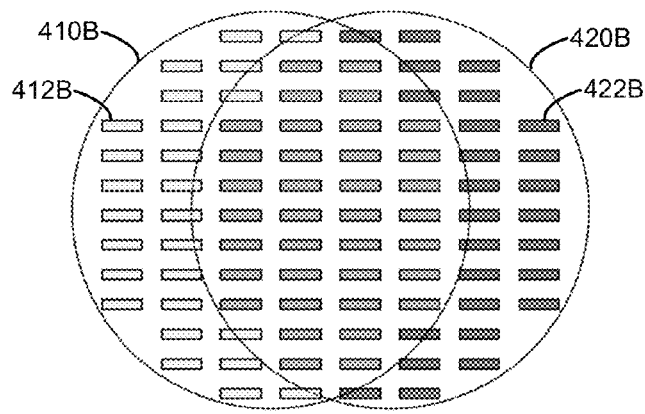
Figure 4C:
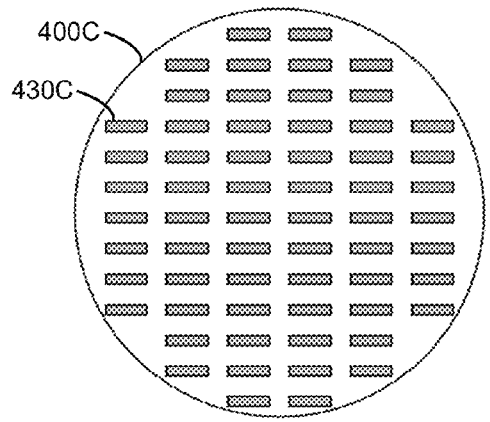

FIGS. 4A-4C are a block diagrams of an assembly of a composite wafer 400C including a molded wafer 410A, 410B according to an example. The molded wafer 410A includes a plurality of first components 412A, that may be arranged in a pattern on the molded wafer 410A. The second wafer 420A includes a plurality of second components 422A, that may be arranged in a corresponding pattern on the second wafer 420A.

The molded wafer 410A and the second wafer 420A may be processed based on a wafer-level process, such as applying a reflective coating. The molded wafer 410A and the second wafer 420A also may be processed based on an attachment of elements to the wafer, such as pick-and-place process whereby elements (e.g., chips or other discrete elements) are picked from a waffle pack or tape and placed onto a wafer. An element may be a III-V device such as a Vertical-Cavity Surface-Emitting Laser (VCSEL), photodiode, or other components such as integrated circuits (ICs), resistors, capacitors, etc. Elements also may be attached to a wafer based on flip-chip bonding, soldering (reflow), or other techniques.

FIG. 4B illustrates the overlapping pattern of the first components 412B and the second components 422B as the molded wafer 410B and the second wafer 420B are aligned and assembled. The molded wafer 410B and the second wafer 420B may be loaded in a batch wafer assembler, or other wafer-level processor, to be aligned and/or assembled. The molded wafer 410B and the second wafer 420B may include alignment marks, or other features, to facilitate alignment.

FIG. 4C illustrates an assembled composite wafer 400C having a plurality of multi-component elements 430C. The composite wafer 400C may be based on bonding or attachment such as glue to assemble multiple wafers together. The composite wafer 400C may be diced or otherwise cut into individual/singulated multi-component elements 430C.

Figure 5A:
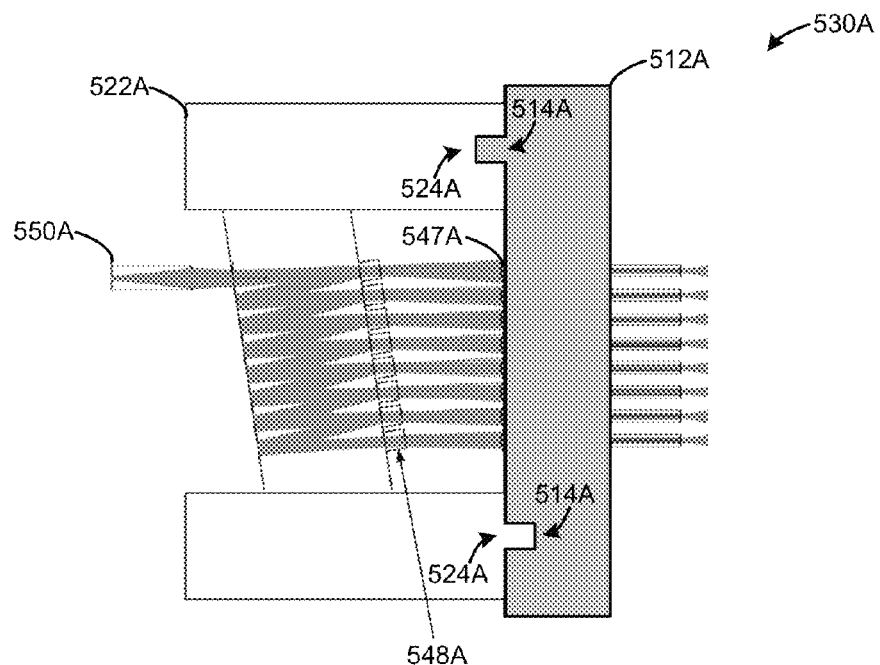
FIG. 5A is a block diagram of a singulated multi-component element based on a first component and a second component according to an example.

FIG. 5A is a block diagram of a singulated multi-component element 530A based on a first component 512A and a second component 522A according to an example. The first component 512A may form part of a molded wafer, having additional neighboring first components (not shown in FIG. 5A). The second component 522A similarly may form part of a second wafer, having additional neighboring second components (not shown in FIG. 5A).

The first component 512A includes first mating features 514A and molded elements 547A. The first mating features 514A may include a hole and a pin, or other features to provide alignment and/or locking. The molded elements 547A may be a lens array, filter, or other moldable component. In alternate examples, the first component 512A may include components that are not molded (e.g., emplaced).

The second component 522A includes second mating features 524A, emplaced elements 548A, and movable element 550A. The emplaced elements 548A may include filter and/or reflector elements (e.g., relay mirrors and/or prisms to provide zig-zag optical multiplexing). The emplaced elements 548A may be Coarse Wavelength Division Multiplexing (CWDM) filters to multiplex and de-multiplex wavelength signals. Furthermore, such devices may be stacked in the axis perpendicular to the page in order to provide Parallel WDM (PWDM) functionality, e.g., stacked 12 deep for a 12×8 array used for PWDM. The movable element 550A similarly may be stacked 12 deep, e.g., to receive a 12×1 array of input signals. The movable element 550A also may be a monolithic movable element to receive an array connector. The 8 CWDM filters shown (emplaced elements 548A) may provide CWDM functionality as a plurality of rectangular prism optics/slabs extending in parallel along the axis perpendicular to the page. The movable element 550A may be a fiber connector, and may be movable to provide a self-alignment function. The movable element 550A may be based on a hinge, such as a living hinge formed from molded materials. Thus, the movable element 550A may mechanically adapt to a position of a fiber to be interfaced with the multi-component element 530A. The movable element 550A may be associated with other elements to provide a staged alignment, e.g., a coarse/bulky alignment stage, coupled to finer and finer stages of alignment. The movable element 550A also may include a floating pin(s).

Figure 5B:
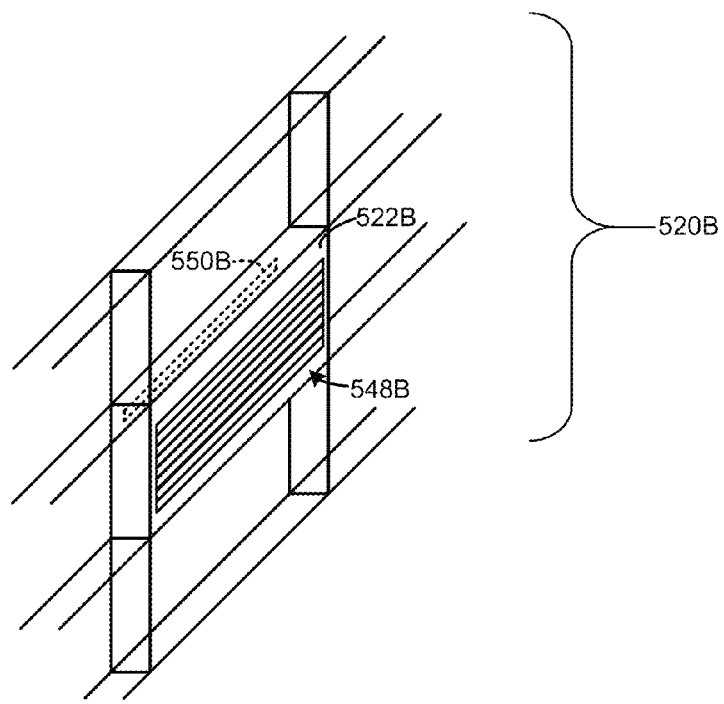
FIG. 5B is a perspective view of a block diagram of a portion of a second wafer including a second component according to an example.

FIG. 5B is a perspective view of a block diagram of a portion of a second wafer 520B including a second component 522B according to an example. The second component 522B is shown with elements 548B, and movable element 550B, provided as a monolithic slab. However, various elements and/or combination of elements of the second component 522B may be emplaced or otherwise provided separately. The second component 522B may include additional elements not specifically shown (e.g., mating features). The second wafer 520B thus may be provided as an array of second components 522B, ready for wafer-scale assembly prior to singulation into separate devices.

Figure 6:
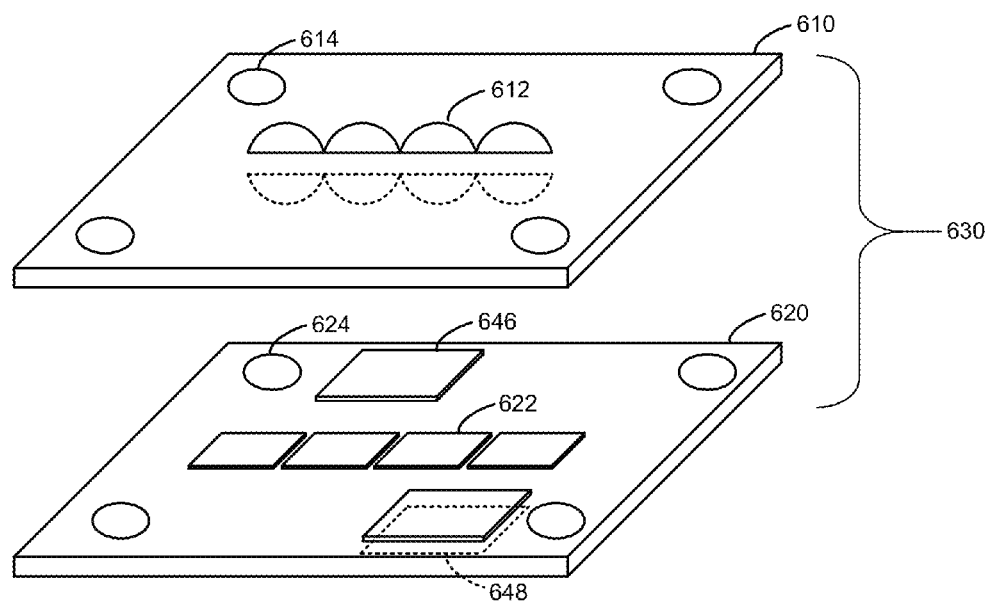
FIG. 6 is an exploded view block diagram of a multi-component element based on a molded wafer and a second wafer according to an example.

FIG. 6 is a block diagram of an exploded view of a multi-component element 630 based on a molded wafer 610 and a second wafer 620 according to an example. The molded wafer 610 includes at least one first mating feature 614 and first component 612 (shown on a top and bottom surface of the molded wafer 610, and may be provided on any surface). The second wafer 620 includes at least one second component 622, at least one second mating feature 624, processed component 646, and emplaced element 648.

The second wafer 620 may be processed by pick-and-place to provide various components, including semiconductor-based integrated circuits, lasers (VCSELs), photodiodes, and other optoelectronics, as well as optical elements such as lenses/lens arrays, prisms, multiplexers/demultiplexers, mirrors, elements to couple fibers, and the like. Examples provided throughout the present application may be based on any such components/elements, including reflective coatings, anti-reflective coatings, Wave Division Multiplexing (WDM) elements, wavelength selective filters, etc., whether moldable, emplacable, or otherwise associated with a wafer.

The multi-component element 630 may be an optical receiver engine, wherein the second wafer 620 is an integrated circuit (IC) wafer, including a plurality of flip-chipped photodiodes as the second components 622. The molded wafer 610 may implement an optical demultiplexing (DE-MUX) function, including provisions for a stand-off spacer. The DEMUX molded wafer 610 may be associated with (e.g., molded/integrated and/or emplaced) Coarse Wavelength Division Multiplexing (CWDM) filters to multiplex and de-multiplex wavelength signals. Furthermore, such devices may be stacked to provide Parallel WDM (PWDM) devices. The CWDM filters may provide PWDM features based on a plurality of rectangular prism optics/slabs arranged in parallel to operate on a plurality of received signals along a length of a prism/slab. The molded wafer 610 and the second wafer 620 may be combined (bonded/glued) and diced to obtain a plurality of singulated multi-component elements 630.

Figure 7:
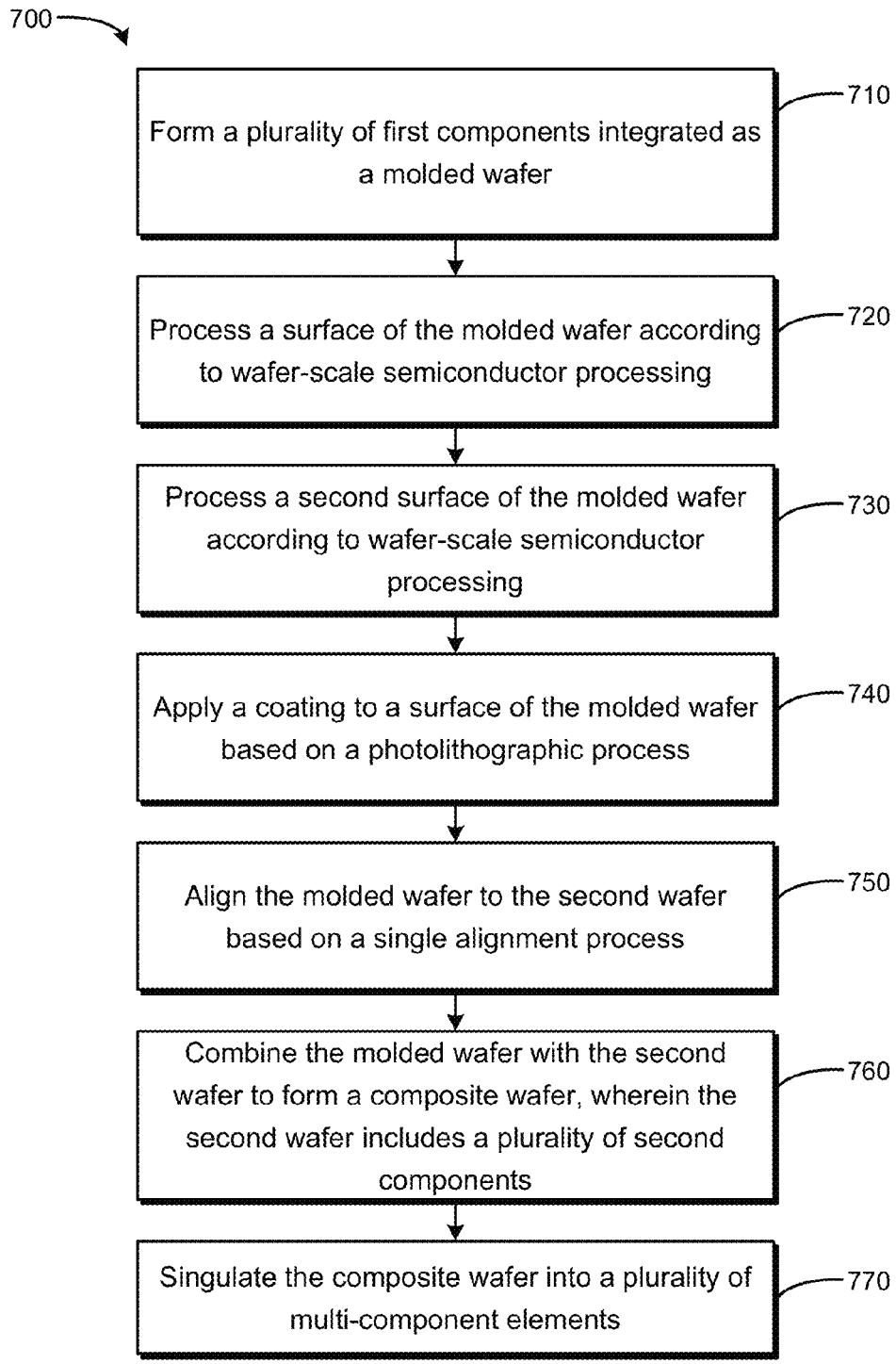
FIG. 7 is a flow chart based on processing a composite wafer according to an example.

FIG. 7 is a flow chart 700 based on processing a composite wafer according to an example. In block 710, a plurality of first components are formed, integrated as a molded wafer. In block 720, a surface of the molded wafer is processed according to wafer-scale semiconductor processing. For example, the wafer may be etched. In block 730, a second surface of the molded wafer is processed according to wafer-scale semiconductor processing. In block 740, a coating is applied to a surface of the molded wafer based on a photolithographic process. In block 750, the molded wafer is aligned to the second wafer based on a single alignment process. In block 760, the molded wafer is combined with the second wafer to form a composite wafer, wherein the second wafer includes a plurality of second components. In block 770, the composite wafer is singulated into a plurality of multi-component elements.

Figure 8:
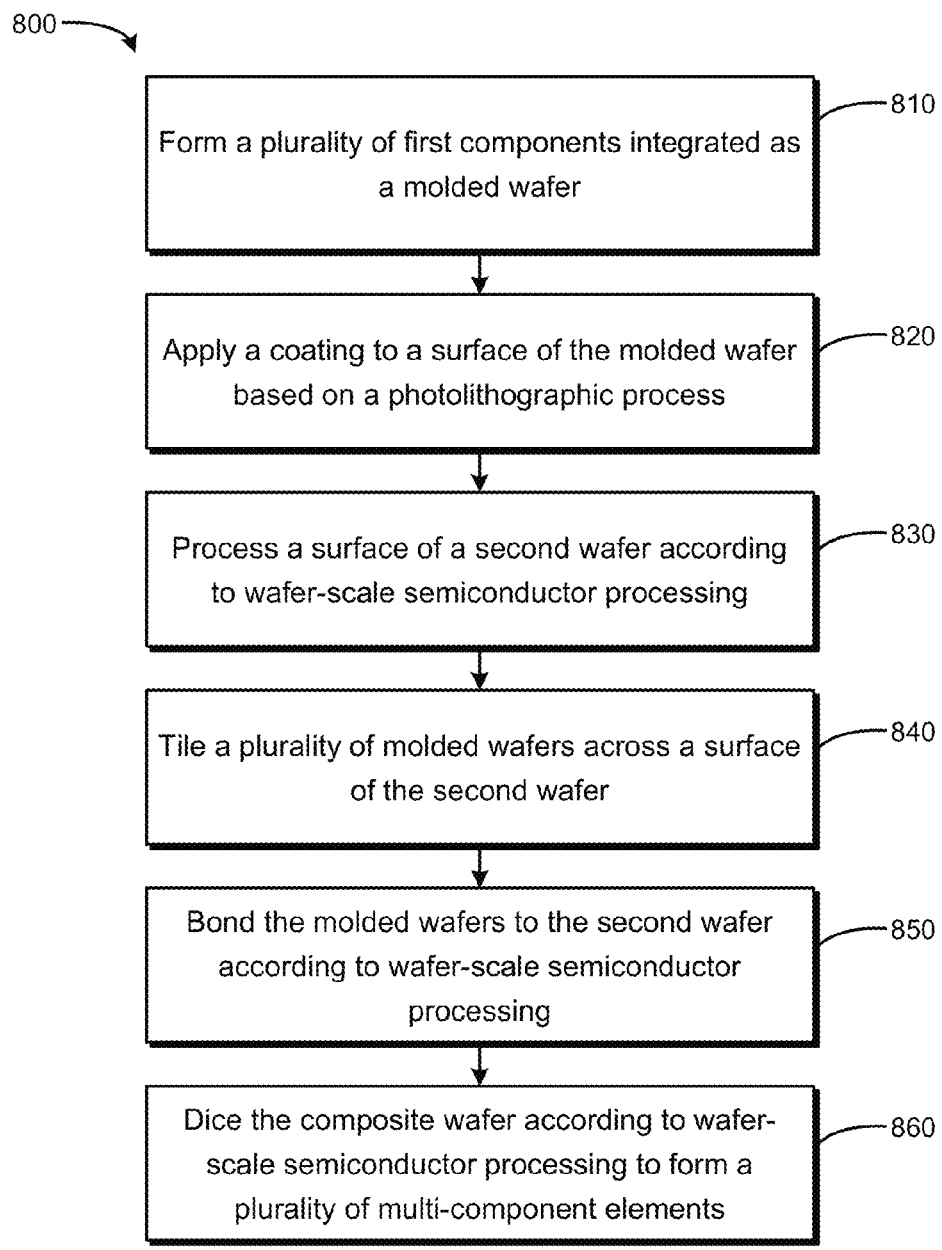
FIG. 8 is a flow chart based on processing a composite wafer according to an example.

FIG. 8 is a flow chart 800 based on processing a composite wafer according to an example. In block 810, a plurality of first components are formed, integrated as a molded wafer. In block 820, a coating is applied to a surface of the molded wafer based on a photolithographic process. In block 830, a surface of a second wafer is processed according to wafer-scale semiconductor processing. In block 840, a plurality of molded wafers are tiled across a surface of the second wafer. In block 850, the molded wafers are bonded to the second wafer according to wafer-scale semiconductor processing. In block 860, the composite wafer is diced according to wafer-scale semiconductor processing to form a plurality of multi-component elements.

What is claimed is:

1. A method, comprising:
    forming a plurality of first components integrated as a molded wafer, each first component including a first mating feature;
    combining the molded wafer with a second wafer to form a composite wafer, the second wafer including a plurality of second components that is aligned with the plurality of first components when the molded wafer is combined with the second wafer, wherein each second component includes a second mating feature that couples to a corresponding first mating feature when the molded wafer is combined with the second wafer; and
    singulating the composite wafer into a plurality of multi-component elements, each multi-component element being formed of a first component and a second component.

2. The method of claim 1, further comprising:
    processing a surface of the molded wafer using wafer-scale semiconductor processing.

3. The method of claim 1, further comprising:
    applying a coating to a surface of the molded wafer based on a photolithographic process.

4. The method of claim 1, wherein each first component includes features that are provided on both sides of the molded wafer.

5. The method of claim 1, further comprising:
    aligning the molded wafer with the second wafer based on a single alignment process.

6. The method of claim 1, further comprising:
    bonding the molded wafer to the second wafer using wafer-scale semiconductor processing.

7. The method of claim 1, wherein singulating the composite wafer includes dicing the composite wafer using wafer-scale semiconductor processing.

8. A method, comprising:
    forming a plurality of molded wafers that each includes a first component, each first component including a first mating feature;
    applying a coating to a surface of each of the molded wafers based on a photolithographic process;
    processing a surface of a second wafer according to wafer-scale semiconductor processing, the second wafer including a plurality of second components, wherein each second component (i) is to align with a corresponding first component of each of the molded wafers, and (ii) includes a second mating feature that is to couple to a corresponding first mating feature of the corresponding first component; and
    tiling the plurality of molded wafers on the surface of the second wafer.

9. The method of claim 8, wherein tiling the plurality of molded wafers includes positioning the plurality of molded wafers on the surface of the second wafer so that the plurality of molded wafers do not overlap one another.

10. The method of claim 8, further comprising:
    bonding the plurality of molded wafers to the surface of the second wafer using wafer-scale semiconductor processing to form a composite wafer.

11. The method of claim 9, further comprising:
    dicing the composite wafer using wafer-scale semiconductor processing.

12. The method of claim 8, wherein each first component includes features that are provided on both sides of the respective molded wafer.

* * * * *